(12) United States Patent
Tsai et al.

(10) Patent No.: US 11,755,058 B2
(45) Date of Patent: Sep. 12, 2023

(54) BRAIN-COMPUTER INTERFACE DEVICE WITH MULTIPLE CHANNELS

(71) Applicant: National Taiwan University of Science and Technology, Taipei (TW)

(72) Inventors: Hong-Wen Tsai, Taipei (TW); Yue-Feng Wu, Taipei (TW)

(73) Assignee: NATIONAL TAIWAN UNIVERSITY OF SCIENCE AND TECHNOLOGY, Taipei (TW)

(*) Notice: Subject to any disclaimer, the term of this patent is extended or adjusted under 35 U.S.C. 154(b) by 105 days.

(21) Appl. No.: 17/405,560

(22) Filed: Aug. 18, 2021

(65) Prior Publication Data

US 2022/0107662 A1  Apr. 7, 2022

(30) Foreign Application Priority Data

Oct. 6, 2020  (TW) .................. 109134515

(51) Int. Cl.
| | |
|---|---|
| G06F 1/06 | (2006.01) |
| H03K 5/24 | (2006.01) |
| G06N 3/12 | (2023.01) |
| H03F 3/04 | (2006.01) |

(52) U.S. Cl.
CPC ................ *G06F 1/06* (2013.01); *G06N 3/12* (2013.01); *H03F 3/04* (2013.01); *H03K 5/24* (2013.01)

(58) Field of Classification Search
CPC .................................. G06F 1/06; H03K 5/24
See application file for complete search history.

(56) References Cited

U.S. PATENT DOCUMENTS

| | | | | |
|---|---|---|---|---|
| 5,519,644 A | * | 5/1996 | Benton .................. | G01K 1/026 73/1.88 |
| 6,064,695 A | * | 5/2000 | Raphaeli .............. | H04B 1/7093 375/135 |
| 7,338,443 B1 | * | 3/2008 | Tucker ................... | G16H 40/20 128/920 |
| 2005/0273170 A1 | | 12/2005 | Navarro et al. | |

(Continued)

FOREIGN PATENT DOCUMENTS

| | | |
|---|---|---|
| CN | 101042925 A | 9/2007 |
| CN | 104013400 A | 9/2014 |

(Continued)

*Primary Examiner* — Phil K Nguyen
(74) *Attorney, Agent, or Firm* — MUNCY, GEISSLER, OLDS & LOWE, P.C.

(57) ABSTRACT

A brain-computer interface device includes a plurality of pre-amplifiers are configured to amplify physiological signals corresponding to channels to output amplified signals; a multiplexer is configured to output, according to a control signal and a clock signal, the amplified signals; an analog-to-digital converter is configured to convert, according to the clock signal including clocks, the output of the multiplexer into a digital signal including a plurality of digital values corresponding to the clocks, wherein each of the digital values includes bit values; a memory is configured to store the digital signal; and a processor s configured to: add a header corresponding to one channel to each of the digital values according to the clock signal; and delete bit values of higher bits of each of the digital values corresponding to the same channel that are the same as those of a previous digital value, to output a compressed signal.

16 Claims, 9 Drawing Sheets

(56) References Cited

U.S. PATENT DOCUMENTS

| | | | |
|---|---|---|---|
| 2016/0211935 A1* | 7/2016 | Fair | H04W 56/001 |
| 2017/0170846 A1* | 6/2017 | Ikegaya | H03M 13/1165 |
| 2019/0174284 A1* | 6/2019 | Gold | G06Q 30/0207 |
| 2020/0218338 A1* | 7/2020 | Lee | G06F 3/013 |

FOREIGN PATENT DOCUMENTS

| | | |
|---|---|---|
| CN | 109620217 A | 4/2019 |
| CN | 111262587 A | 6/2020 |
| JP | S58140810 A | 8/1983 |
| JP | S63500434 A | 2/1988 |
| JP | 2005021452 A | 1/2005 |
| JP | 2005161025 A | 6/2005 |
| JP | 2008035039 A | 2/2008 |
| JP | 2017028555 A | 2/2017 |
| JP | 2018200666 A | 12/2018 |
| JP | 2019161556 A | 9/2019 |
| JP | 2020023019 A | 2/2020 |

* cited by examiner

| Time point | Corresponding amplified signals E1-E16 | Digital values of digital signal Y |
|---|---|---|
| D1 | E1 | 01111111111111 |
| | E2 | 00000000000000 |
| | ⋮ | ⋮ |
| | E16 | 00000000000000 |
| D2 | E1 | 01111111100100 |
| | E2 | 00000000000000 |
| | ⋮ | ⋮ |
| | E16 | 00000000000000 |
| D3 | E1 | 10000000011011 |
| | E2 | 00000000000000 |
| | ⋮ | ⋮ |
| | E16 | 00000000000000 |
| D4 | E1 | 01111111111111 |
| | E2 | 00000000000000 |
| | ⋮ | ⋮ |
| | E16 | 00000000000000 |
| D5 | E1 | 10101010101010 |
| | E2 | 01011101110111 |
| | ⋮ | ⋮ |
| | E16 | 00000000000000 |
| D6 | E1 | 10101010001110 |
| | E2 | 01011101011100 |
| | ⋮ | ⋮ |
| | E16 | 00000000000000 |
| D7 | E1 | 10101011000101 |
| | E2 | 01011110010010 |
| | ⋮ | ⋮ |
| | E16 | 00000000000000 |
| D8 | E1 | 10101010101010 |
| | E2 | 01011101110111 |
| | ⋮ | ⋮ |
| | E16 | 00000000000000 |

FIG. 6B

| Time point | Corresponding amplified signals E1-E16 | Digital values of compressed signal Z |
|---|---|---|
| D1 | E1 | 0001111111111111 |
| | E2 | 00 — H |
| | ⋮ | ⋮ |
| | E16 | 00 |
| D2 | E1 | 0000100 |
| | E2 | 00 |
| | ⋮ | ⋮ |
| | E16 | 00 |
| D3 | E1 | 0010000000011011 |
| | E2 | 00 |
| | ⋮ | ⋮ |
| | E16 | 00 |
| D4 | E1 | 000111111111111 |
| | E2 | 00 |
| | ⋮ | ⋮ |
| | E16 | 00 |
| D5 | E1 | 0010101010101010 |
| | E2 | 0001011101110111 |
| | ⋮ | ⋮ |
| | E16 | 00 |
| D6 | E1 | 00001110 |
| | E2 | 00011100 |
| | ⋮ | ⋮ |
| | E16 | 00 |
| D7 | E1 | 001000101 |
| | E2 | 0010010010 |
| | ⋮ | ⋮ |
| | E16 | 00 |
| D8 | E1 | 000101010 |
| | E2 | 0001110111 |
| | ⋮ | ⋮ |
| | E16 | 00 |

FIG. 7B

BRAIN-COMPUTER INTERFACE DEVICE WITH MULTIPLE CHANNELS

CROSS-REFERENCE TO RELATED APPLICATION

This non-provisional application claims priority under 35 U.S.C. § 119(a) to Patent Application No. 109134515 filed in Taiwan, R.O.C. on Oct. 6, 2020, the entire contents of which are hereby incorporated by reference.

BACKGROUND

Technical Field

The present invention relates to data receiving and transmitting technologies, and in particular, to a brain-computer interface device for data compression of physiological signals in multiple channels.

Related Art

In recent years, medical technologies are booming, and electronic devices used in the medical technologies play an indispensable role in, for example, collection and measurement of physiological signals (brain wave signals, electrocardiogram signals, electromyogram signals, and the like). In particular, brain wave signals need to be collected by using a plurality of signal channels. For example, a plurality of electrodes are connected to a brain, and a brain wave signal measurement device obtains a plurality of brain wave signals through the electrodes. During collection of physiological signals by using a plurality of signal channels, due to a relatively large amount of data, data is usually transmitted through wired transmission. However, since a physiological signal measurement device is generally worn on a patient, wired transmission causes inconvenience to the patient during movement, and an increase in a volume of the physiological signal measurement device, resulting in inconvenience in carrying.

In addition, general wireless transmission has a bandwidth limitation on data transmission, causing an incapability of transmission of a large amount of data. Therefore, during wireless transmission, a multi-channel physiological signal measurement device cannot transmit a large amount of undistorted data at one time. In addition, in order to maximize transmission of physiological data related to physiological signals, maximum transmission power consumption is usually required for the wireless transmission, causing an increase in power consumption of the multi-channel physiological signal measurement device. In addition, thermal energy increases due to the increase power consumption. Thus, in order to reduce the increased thermal energy, a volume of internal modules for heat dissipation is also increased.

SUMMARY

In view of the above, the present invention provides a brain-computer interface device with multiple channels, which is adapted to process a physiological signal and can generate an undistorted compressed signal. Therefore, in some embodiments, a large amount of undistorted data can be transmitted at one time through the compressed signal during wireless transmission, and power consumption and a volume of internal modules can be reduced.

According to some embodiments, the brain-computer interface device with multiple channels is adapted to process a plurality of physiological signals. The brain-computer interface device with multiple channels includes a plurality of pre-amplifiers, a multiplexer, an analog-to-digital converter, a memory, and a processor. The plurality of pre-amplifiers are respectively configured to amplify the physiological signals to output amplified signals, where each of the pre-amplifiers corresponds to one of the channels. The multiplexer is configured to respectively output, according to a control signal and a clock signal, the amplified signals. The analog-to-digital converter is configured to convert the output of the multiplexer to a digital signal according to the clock signal. The digital signal includes a plurality of digital values. The clock signal includes a plurality of clocks. The digital values respectively correspond to the clocks, and each of the digital values includes a plurality of bit values. The memory is configured to store the digital signal. The processor is configured to: add a header to each of the digital values according to the clock signal, where the headers respectively correspond to the channels; and delete bit values of higher bits of each of the digital values corresponding to the same channel that are the same as those of a previous digital value, to output a compressed signal.

Based on the above, according to some embodiments, the physiological signal is received through each of the channels and is converted from an analog signal to a digital signal. The compressed signal is generated by deleting bit values of higher bits of each of the digital values corresponding to the same channel that are the same as those of a previous digital value, so that not only the compressed signal has digital values related to the physiological signal of each of the channels, but also a plurality of digital values related to the physiological signals can be encompassed in a minimum data transmission amount. In this way, an external data receiving and processing terminal (for example, an operational device such as a desktop computer, a laptop computer, and the like) can obtain a large amount of physiological data (such as an electroencephalogram and the like) related to the physiological signals at one time by decoding the compressed signal. Therefore, efficiency of data transmission is improved, a large amount of undistorted data can be transmitted at one time during wireless transmission, and the power consumption of the brain-computer interface device with multiple channels and the volume of the internal modules are reduced. In addition, the brain-computer interface device with multiple channels may also determine, through a comparator, whether the output of the multiplexer is greater than the threshold value, to filter out a non-effective physiological signal (such as noise).

BRIEF DESCRIPTION OF THE DRAWINGS

FIG. 6B illustrates a digital value corresponding to the digital signal in FIG. 6A.

FIG. 7B illustrates a digital value corresponding to the compressed signal in FIG. 7A.

DETAILED DESCRIPTION

Some terms are used in this specification to refer to specific elements. Those with ordinary skill in the art should understand that hardware manufacturers may refer to the same element with different names. Elements should be distinguished between each other by using differences in functions of the elements as a criterion instead of difference in name. The term "include" and "comprise" mentioned in this specification is an open term and therefore should be explained as "include but not limited to" and "comprise but not limited to". In addition, the term "coupling" herein includes any direct and indirect electrical connection means. Therefore, an expression that "a first device is coupled to a second device" described herein means that the first device may be directly electrically connected to the second device or indirectly electrically connected to the second device through other devices or connecting means.

Figure 1:
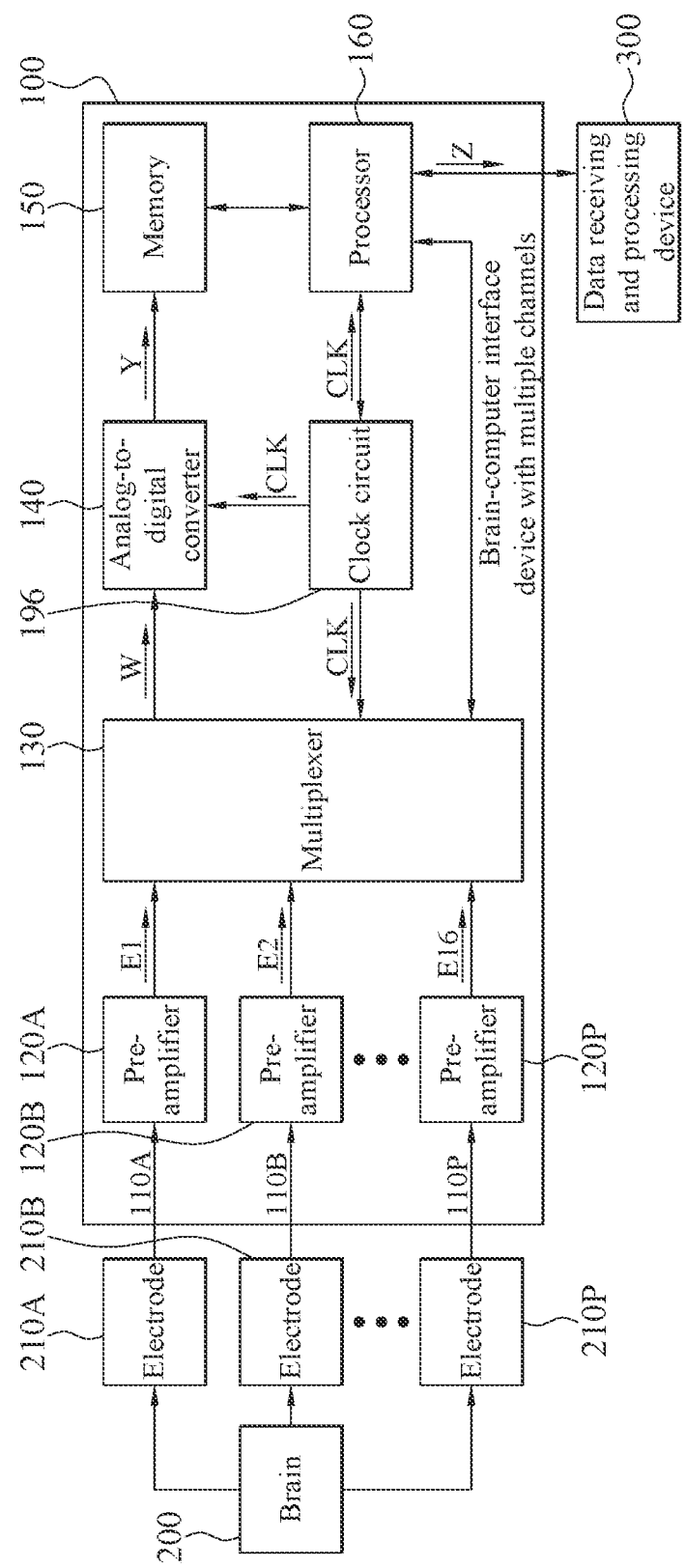
FIG. 1 illustrates a schematic circuit block diagram of a brain-computer interface device with multiple channels according to some embodiments.

Referring to FIG. 1, FIG. 1 illustrates a schematic circuit block diagram of a brain-computer interface device 100 with multiple channels according to some embodiments. According to some embodiments, the brain-computer interface device 100 with multiple channels is adapted to process a plurality of physiological signals. The physiological signal may be a brain wave signal. For ease of description, the brain wave signal is exemplified as a physiological signal herein below, but the present invention is not limited thereto. The brain-computer interface device 100 with multiple channels is coupled to a plurality of electrodes 210A-210P connected to a brain 200, and the brain-computer interface device 100 receives a plurality of brain wave signals (that is, physiological signals) from the brain 200 through a plurality of channels 110A-110P formed through coupling to the electrodes 210A-210P. The channels 110A-110P may be signal channels. For ease of description, a number of the electrodes 210A-210P and a number of the channels 110A-110P respectively are 16 by way of example, but the present invention is not limited thereto, and the numbers each may also be 2, 4, 8, 32, 64, or the like. In some embodiments, the number of the electrodes 210A-210P and the number of the channels 110A-110P may each be a multiple of 2. In some embodiments, the electrodes 210A-210P may be invasive electrodes or non-invasive electrodes. In some embodiments, the physiological signal is an analog signal.

The brain-computer interface device 100 with multiple channels is a data transceiver having a circuit configured to process a plurality of signal inputs, especially a data transceiver having a circuit configured to process a plurality of physiological signal inputs. The circuit may be a hybrid circuit including a signal amplification circuit, an analog-to-digital signal circuit, and a signal processing circuit. The data transceiver may be implemented by a chip having the above circuit.

In some embodiments, the brain-computer interface device 100 with multiple channels includes a plurality of pre-amplifiers 120A-120P, a multiplexer 130, an analog-to-digital converter 140, a memory 150, and a processor 160. The pre-amplifiers 120A-120P are coupled to the electrodes 210A-210P in a one-to-one manner. The multiplexer 130 is coupled to the pre-amplifiers 120A-120P. The analog-to-digital converter 140 is coupled to the multiplexer 130. The memory 150 is coupled to the analog-to-digital converter 140. The processor 160 is coupled to the memory 150 and the multiplexer 130. In some embodiments, the pre-amplifiers 120A-120P are respectively coupled to the electrodes 210A-210P through the channels 110A-110P. Therefore, each of the pre-amplifiers 120A-120P corresponds to one of the channels 110A-110P, and a number of the pre-amplifiers 120A-120P is the same as the number of the electrodes 210A-210P and the number of the channels 110A-110P.

Figure 2:
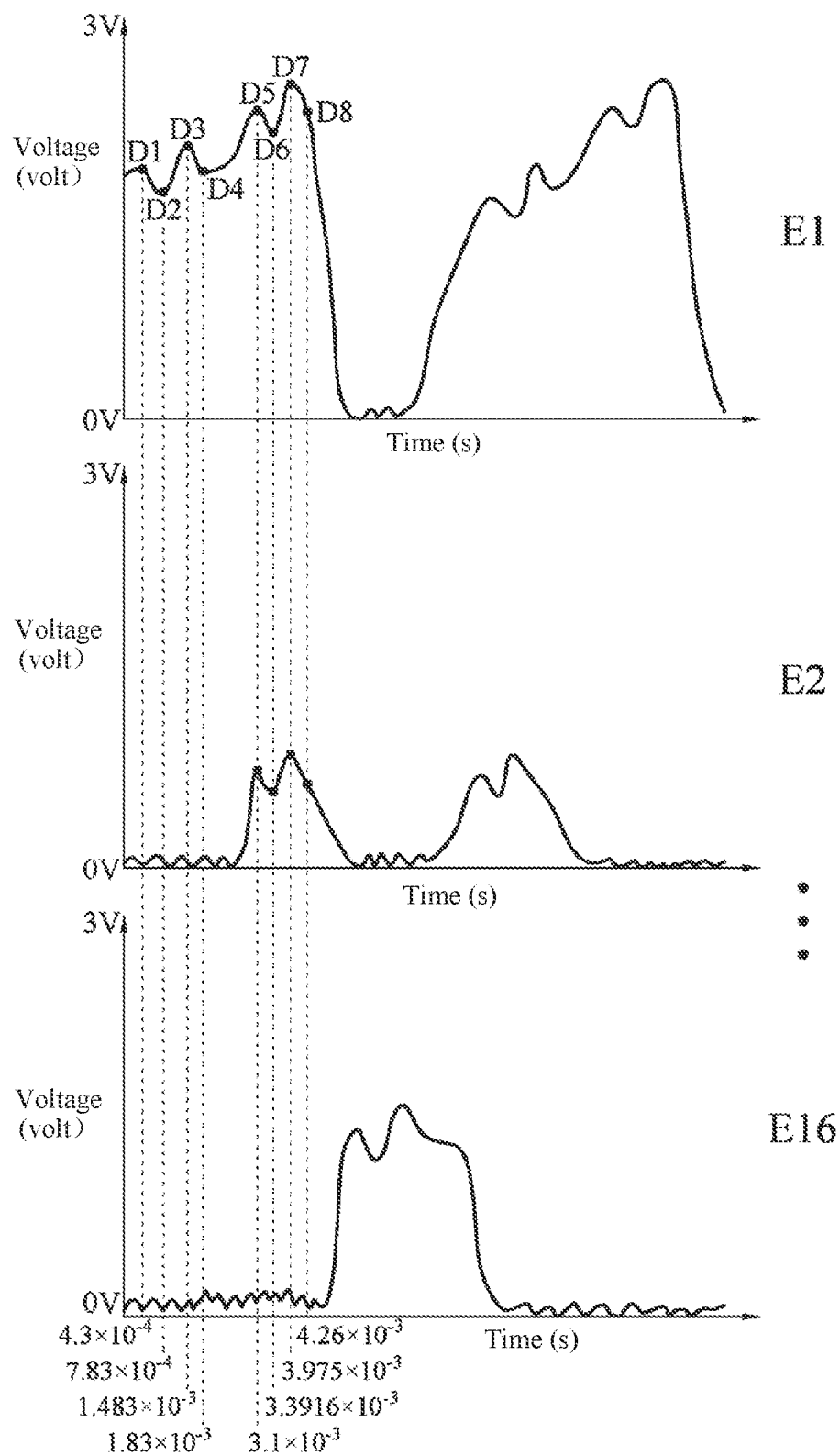
FIG. 2 illustrates a schematic waveform diagram of an amplified signal according to some embodiments.

Referring to FIG. 2, FIG. 2 illustrates a schematic waveform diagram of amplified signals E1-E16 according to some embodiments. For ease of description, FIG. 2 illustrates only waveforms of the amplified signals E1, E2, and E16 in detail. The pre-amplifiers 120A-120P are respectively configured to amplify the physiological signals received from the electrodes 210A-210P to output one of the amplified signals E1-E16 to the multiplexer 130. For example, the pre-amplifiers 120A-120P are respectively configured to amplify voltage amplitudes of the physiological signals. The physiological signal is generally a weak signal, for example, only has a slight change in a voltage. Therefore, the pre-amplifiers 120A-120P respectively amplify the physiological signals and output the amplified signals E1-E16 to facilitate processing by other circuits. For example, the brain wave signal has a change between 10 microvolts and 100 microvolts in the voltage (a change in a voltage amplitude). If the signal is not amplified, other circuits cannot perform operations, or malfunction is caused and the circuits cannot obtain a correct result. The pre-amplifiers 120A-120P are, for example but not limited to operational amplifiers, various types of power amplifiers, differential amplifiers, or the like. In some embodiments, the amplified signals E1-E16 are analog signals.

Figure 3:
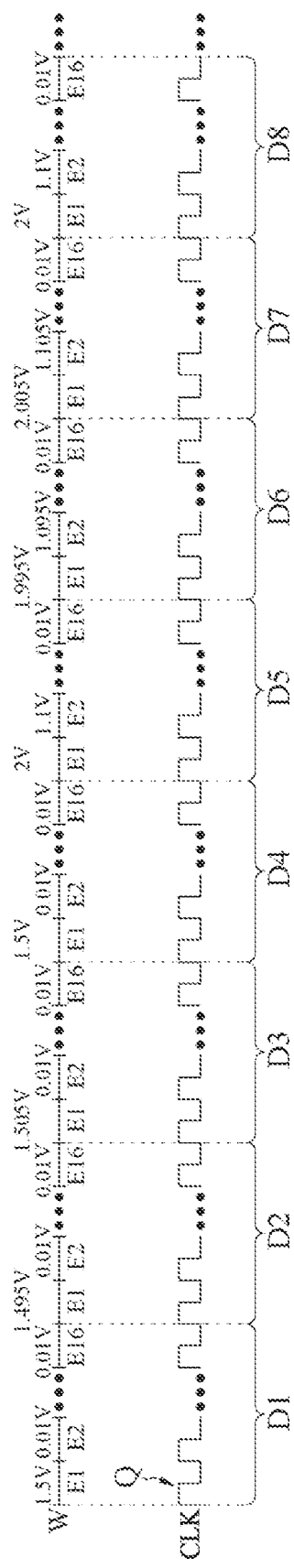
FIG. 3 illustrates a schematic diagram of a signal outputted by a multiplexer according to some embodiments.

Referring to FIG. 2 and FIG. 3, FIG. 3 illustrates a schematic diagram of a signal W outputted by the multiplexer 130 according to some embodiments. For ease of description, FIG. 3 schematically illustrates only a voltage value of the signal W outputted by the multiplexer 130 without an actual waveform, and illustrates only voltage values in the signal W corresponding to the amplified signals E1, E2, and E16 in detail. The multiplexer 130 is configured to respectively output, according to a control signal and a clock signal CLK, the amplified signals E1-E16 (that is, the signal W). In some embodiments, the multiplexer 130 includes a plurality of input terminals, an output terminal, a control terminal, and a clock terminal. The multiplexer 130 respectively receives the amplified signals E1-E16 from the pre-amplifiers 120A-120P through the input terminals. The multiplexer 130 is controlled by a control signal from the control terminal and a clock signal CLK from the clock terminal to respectively output the received amplified signals E1-E16. Specifically, the multiplexer 130 switches, according to a rising edge or a falling edge of a clock Q of the clock signal CLK and a logic value of the control signal, the amplified signals E1-E16 outputted by the output terminal.

The rising edge and 16 channels are exemplified. The multiplexer 130 is triggered by the rising edge of the clock Q (which is referred to as a first clock herein) to switch, according to a logic value of a control signal from the processor 160, the output terminal to output the amplified signal E1 from the pre-amplifier 120A. When a rising edge of a next clock Q (which is referred to as a second clock herein) approaches, the multiplexer 130 switches, according to the logic value of the control signal, the output terminal to output the amplified signal E2 from the pre-amplifier 120B, and so on, until the multiplexer 130 switches, according to a rising edge of a sixteenth clock and the logic value of the control signal, the output terminal to output the amplified signal E16 from the pre-amplifier 120P (that is, the multiplexer 130 has outputted voltage values of the amplified signals E1-E16 corresponding to the same time point (for example, a time point D1 or a time point D5)). After the amplified signals E1-E16 are outputted in one of the time points, the process is repeated to continuously switch the amplified signals E1-E16 in sequence outputted by the output terminal (that is, the multiplexer 130 continuously output, through the output terminal, voltage values of the amplified signals E1-E16 corresponding to subsequent time points (for example, time points D2, D3, and D4 or time points D6, D7, and D8)). In some embodiments, the control signal is a logic signal, and a logic value of the control signal varies according to the clock Q, so that the processor 160 controls, through the control signal, the multiplexer 130 to sequentially switch the amplified signals E1-E16 outputted by the output terminal. In some embodiments, after outputting all of the received amplified signals E1-E16 corresponding to the same time point through the output terminal, the multiplexer 130 continues to output the amplified signals E1-E16 at the output terminal according to the previous output sequence.

For another example, the multiplexer 130 may switch, in a specific order according to the control signal, the amplified signals E1-E16 outputted by the output terminal. For example, when rising edges of the first clock to the eighth clock approach, the multiplexer 130 outputs amplified signals E2, E4, E6, E8, E10, E12, E14, and E16 from pre-amplifiers 120B, 120D, 120F, 120H, 120J, 120L, 120N, and 120P respectively at the output terminal according to the control signal, but the present invention is not limited thereto. In some embodiments, the multiplexer may be implemented by a many-to-one multiplexer circuit.

Referring to FIG. 1 again, the analog-to-digital converter (ADC) 140 is configured to convert the output (the signal W) of the multiplexer 130 to a digital signal Y according to the clock signal CLK. The clock signal CLK includes a plurality of clocks Q. Specifically, the analog-to-digital converter 140 operates according to the clocks Q of the clock signal CLK, and digitizes the amplified signals E1-E16 received from the multiplexer 130 at different clocks Q to generate the digital signal Y. The digital signal Y includes a plurality of digital values. The digital value may be a logic value. The digital values respectively correspond to the clocks Q. The digital values respectively correspond to the amplified signals E1-E16 received by the analog-to-digital converter 140 at the clocks Q corresponding to the digital value. In other words, a logic value generated after the analog-to-digital converter digitizes the voltage values of the amplified signals E1-E16 is the digital value. Each of the digital values includes a plurality of bit values. A number of the bit values is a number of bits of the digital value, that is, resolution of the analog-to-digital converter 140. In some embodiments, a number of the bit values for each of the digital values may be 14, that is, the analog-to-digital converter 140 has 14-bit resolution, but the present invention is not limited thereto. In some embodiments, the analog-to-digital converter 140 is, for example but not limited to, various analog-to-digital converters such as a direct analog-to-digital converter, an integral analog-to-digital converter, and the like.

The memory 150 is configured to store the digital signal Y. Specifically, the memory 150 stores the digital values of the digital signal Y. In some embodiments, the memory 150 is, for example but not limited to any or any combination of a static random access memory (SRAM), an instruction register, an address register, a general purpose register, a flag register, and a cache memory.

The processor 160 is configured to transmit a control signal to control the multiplexer 130 to add a header H to each of the digital values according to the clock signal CLK. The headers H respectively correspond to the channels 110A-110P. For example, the processor 160 reads the digital signal Y in the memory 150 according to the clock Q of the clock signal CLK, and the processor 160 determines the amplified signals E1-E16 corresponding to the digital values according to the clock Q of the clock signal CLK, to determine the pre-amplifiers 120A-120P corresponding to the amplified signals E1-E16, to determine the channels 110A-110P corresponding to the digital values, thereby adding the header H corresponding to each of the channels 110A-110P to each of the digital values. The header H may be a logic value having a preset bit length (for example, a two-bit logic value) for the processor 160 or an external data receiving and processing device 300 to identify each of the digital values is corresponded to which one of the channels 110A-110P.

The processor 160 deletes bit values of higher bits of each of the digital values corresponding to the same one of the channels 110A-110P that are the same as those of a previous digital value, to output a compressed signal Z. The data receiving and processing device 300 receives the compressed signal Z and performs a decoding process to obtain undistorted physiological data (detailed later) related to the physiological signals. For example, a number of bit values of each of the digital values is 14. In those digital values corresponding to the same channel 110A-110P, when a logic value formed by bit values of one (which is referred to as a second digital value herein) of the digital values is "10101000111010" and a logic value formed by bit values of a previous digital value (which is referred to as a first digital value herein, that is, the first digital value is the previous digital value of the second digital value) is "10101010101010", bit values of higher bits of the second digital value that are the same as those of the first digital value are deleted. For example, six bit values from a most significant bit to a least significant bit are deleted, bit values "101010" of the higher bits of the second digital value is deleted so that the second digital value is left with only "00111010" (that is, left with only eight bit values). The processor 160 reads the memory 150 and performs the above process on the digital signal Y to output the compressed signal Z (obtained after a number of bit values in the digital value is reduced).

The previous digital value is explained as follows. In those digital values corresponding to the same channel 110A-110P, if a timing (which is referred to as a first timing herein) of a clock Q corresponding to the first digital value is earlier than a timing (which is referred to as a second timing herein) of a clock Q corresponding to the second digital value, and the first timing is closer to the second timing than other timings corresponding to the digital values that are also earlier than the second timing, the first digital value is a previous digital value of the second digital value. For example, as shown in FIG. 2 and FIG. 3, a digital value corresponding to the amplified signal E1 at the time point D1 is a previous digital value of a digital value corresponding to the amplified signal E1 at the time point D2.

In some embodiments, the processor 160 is, for example but not limited to an operational circuit such as a central processing unit, a microprocessor, an application-specific integrated circuit (ASIC), a system on a chip (SOC), or the like.

Figure 4:
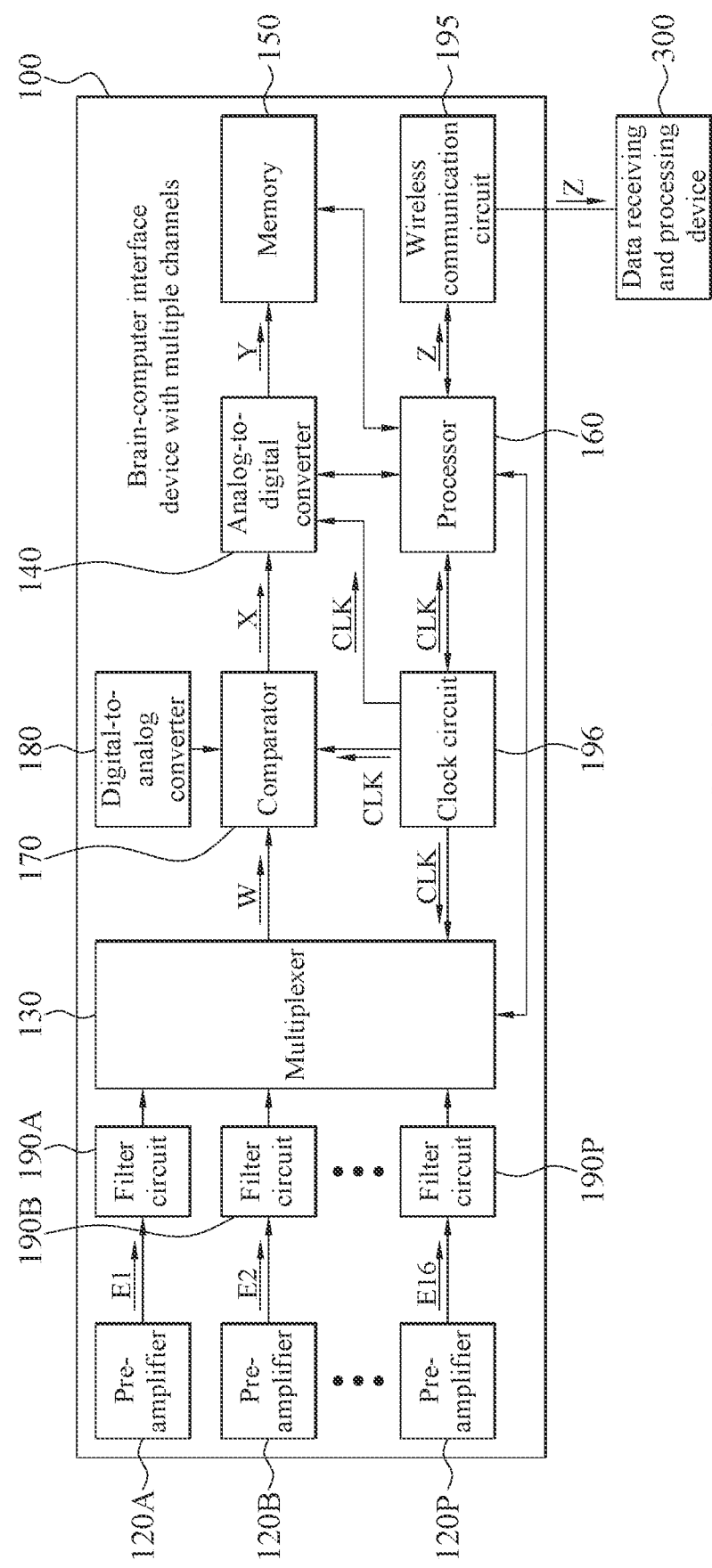
FIG. 4 illustrates a schematic circuit block diagram of a brain-computer interface device with multiple channels according to some embodiments.

Referring to FIG. 4, FIG. 4 illustrates a schematic circuit block diagram of a brain-computer interface device 100 with multiple channels according to some embodiments. In some embodiments, the brain-computer interface device 100 with multiple channels further includes a comparator 170. The comparator 170 is coupled to a multiplexer 130 and an analog-to-digital converter 140. The comparator 170 is configured to obtain, according to a clock signal CLK, an output signal W of the multiplexer 130, and a threshold value, a comparison result X. Specifically, the comparator 170 operates according to the clock signal CLK, and the comparator 170 obtains, according to the signal W outputted by the multiplexer 130 and the threshold value, the comparison result X. In some embodiments, the comparator 170 is, for example but not limited to an operational discharge comparator, a dedicated voltage comparator, or the like. In some embodiments, the comparison result X may be an analog signal.

Figure 5:
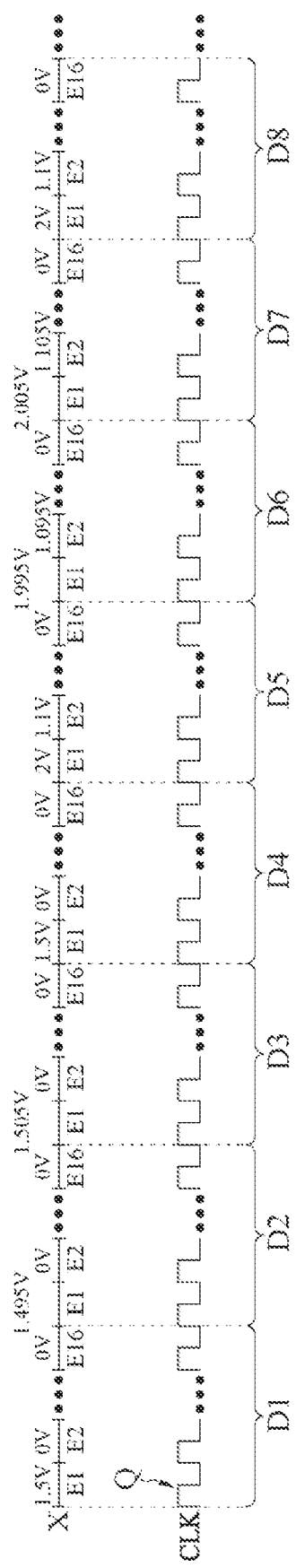
FIG. 5 illustrates a schematic diagram of a comparison result of a comparator according to some embodiments.

Referring to FIG. 5, FIG. 5 illustrates a schematic diagram of the comparison result X of the comparator 170 according to some embodiments. For ease of description, FIG. 5 schematically illustrates only a voltage value of the comparison result X at each clock Q without an actual waveform, and illustrates only voltage values in the comparison result X corresponding to amplified signals E1, E2, and E16 in detail. When the voltage value of the output signal of the multiplexer 130 is greater than the threshold value, the comparator 170 uses the signal W outputted by the multiplexer 130 as the comparison result X. When the voltage value of the signal outputted by the multiplexer 130 is not greater than the threshold value, the comparator 170 uses a predetermined level as the comparison result X. The predetermined level may be a low data level or a low analog level, for example, a voltage value of 0 volts. The brain wave signal is exemplified. Generally, when the brain is inactive, a voltage level of the brain wave signal of the brain is low, for example, less than 0.1 volts. Alternatively, when noise occurs, a voltage level generated by the brain is also low. Therefore, the threshold value may be set to 0.1 volts to filter out a non-effective brain wave signal (for example, to filter out noise or a signal measured when the brain is inactive). For example, the comparator 170 compares the threshold value with voltage values of all of the amplified signals E1-E16 outputted by the multiplexer 130. When the voltage values are greater than the threshold value, the voltage values of the amplified signals E1-E16 outputted by the multiplexer 130 are retained as the comparison result X. When the voltage values are not greater than the threshold value, the predetermined level is used as the comparison result X (in other words, the voltage values of the amplified signals E1-E16 outputted by the multiplexer 130 that are not greater than the threshold value are replaced with the predetermined level).

Referring to FIG. 4 again, in some embodiments, the brain-computer interface device 100 with multiple channels further includes a digital-to-analog converter (DAC) 180. The digital-to-analog converter 180 is coupled to the comparator 170. The digital-to-analog device 180 is configured to convert a set value to a threshold value. Specifically, the digital-to-analog converter 180 analogizes the set value to generate a threshold value. The comparator 170 obtains the threshold value from the digital-to-analog device 180. The set value may be a logic value. The set value and the threshold value may be set according to the characteristics of the physiological signal. For example, when the brain is inactive, the voltage level of the brain wave signal of the brain is low, for example, lower than 0.1 volts. Therefore, the set value may be set to a logic value corresponding to 0.1 volts and is converted by the digital-to-analog device 180 to generate the threshold value. The threshold value may be an analog level. In some embodiments, the set value may be stored in a register of the digital-to-analog device 180. In some embodiments, the set value may be stored in the register of the digital-to-analog device converter 180 before delivery or during maintenance of the brain-computer interface device 100 with multiple channels.

Figure 6A:
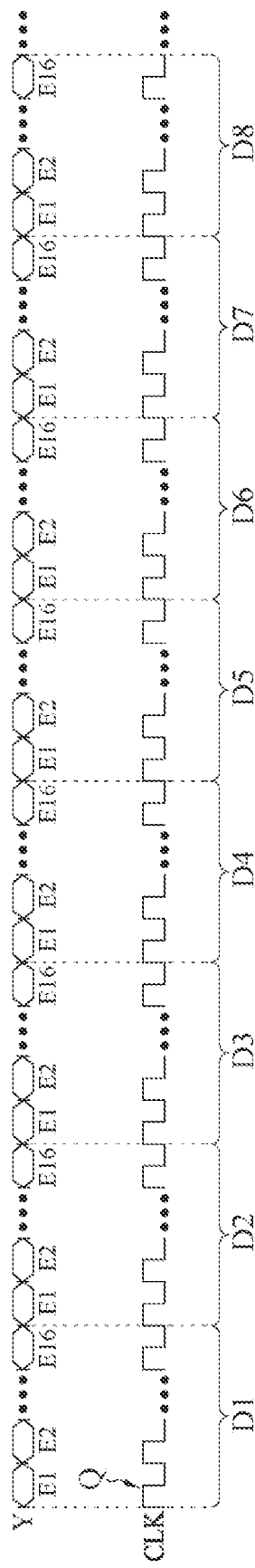
FIG. 6A illustrates a schematic diagram of a digital signal converted based on the comparison result according to some embodiments.

Referring to FIG. 6A and FIG. 6B, FIG. 6A illustrates a schematic diagram of the digital signal Y converted based on the comparison result X according to some embodiments, and FIG. 6B illustrates a digital value corresponding to the digital signal Y in FIG. 6A. For ease of description, FIG. 6B illustrates only digital values of the digital signal Y corresponding to the amplified signals E1, E2, and E16 in detail. In some embodiments, the analog-to-digital converter 140 is configured to convert the comparison result X to the digital signal Y according to the clock signal CLK.

Figure 7A:
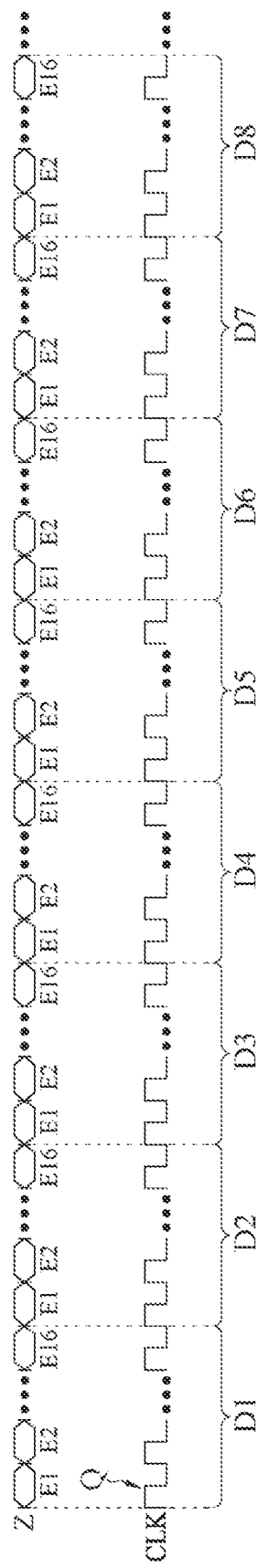
FIG. 7A illustrates a schematic diagram of a compressed signal generated by a processor by performing a process of deleting bit values of the digital signal converted based on the comparison result according to some embodiments.

Referring to FIG. 7A and FIG. 7B, FIG. 7A illustrates a schematic diagram of the compressed signal Z generated by the processor 160 by performing a process of deleting bit values of the digital signal Y converted based on the comparison result X according to some embodiments, and FIG. 7B illustrates a digital value corresponding to the compressed signal Z in FIG. 7A. For ease of description, FIG. 7B illustrates only digital values of the compressed signal Z corresponding to the amplified signals E1, E2, and E16 in detail. The header H corresponding to each of the channels 110A-110P is represented by a two-bit logic value 0 (that is, those underlined in the following table and FIG. 7B), but the present invention is not limited thereto. The processor 160 is configured to delete bit values of higher bits of each of the digital values corresponding to the same one of the channels 110A-110P that are the same as those of the previous digital value, where the higher bit does not include the least significant bit, and the processor 160 is configured to delete bit values of the digital values corresponding to the predetermined level to output the compressed signal Z. Specifically, the rest of bit values in each of the digital values except the bit value of the least significant bit may be selectively deleted by the processor 160 according to conditions. It can be seen from FIG. 6A to FIG. 7B and the following table, the processor 160 compresses the digital signal Y by deleting the bit values of the same higher bit in the digital value, so that the outputted compressed signal Z can accommodate a plurality of digital values at one time, thereby increasing an upper limit of an amount of data that can be outputted by using the compressed signal Z of the brain-computer interface device 100 with multiple channels at one time.

The following table is a comparison table of the digital values of the digital signal Y and the compressed signal Z.

| Time point | Corresponding amplified signals E1-E16 | Digital value of the digital signal Y | Digital value of the compressed signal Z |
|---|---|---|---|
| D1 | E1 | 01111111111111 | 0001111111111111 |
|  | E2 | 00000000000000 | 00 |
|  | . | . | . |
|  | . | . | . |
|  | . | . | . |
|  | E16 | 00000000000000 | 00 |
| D2 | E1 | 01111111100100 | 0000100 |
|  | E2 | 00000000000000 | 00 |
|  | . | . | . |
|  | . | . | . |
|  | . | . | . |
|  | E16 | 00000000000000 | 00 |
| D3 | E1 | 10000000011011 | 0010000000011011 |
|  | E2 | 00000000000000 | 00 |
|  | . | . | . |
|  | . | . | . |
|  | . | . | . |
|  | E16 | 00000000000000 | 00 |
| D4 | E1 | 01111111111111 | 000111111111111 |
|  | E2 | 00000000000000 | 00 |
|  | . | . | . |
|  | . | . | . |
|  | . | . | . |
|  | E16 | 00000000000000 | 00 |
| D5 | E1 | 10101010101010 | 0010101010101010 |
|  | E2 | 01011101110111 | 0001011101110111 |
|  | . | . | . |
|  | . | . | . |
|  | . | . | . |
|  | E16 | 00000000000000 | 00 |
| D6 | E1 | 10101010001110 | 00001110 |
|  | E2 | 01011101011100 | 00011100 |
|  | . | . | . |
|  | . | . | . |
|  | . | . | . |
|  | E16 | 00000000000000 | 00 |
| D7 | E1 | 10101011000101 | 001000101 |
|  | E2 | 01011110010010 | 0010010010 |
|  | . | . | . |
|  | . | . | . |
|  | . | . | . |
|  | E16 | 00000000000000 | 00 |
| D8 | E1 | 10101010101010 | 000101010 |
|  | E2 | 01011101110111 | 0001110111 |
|  | . | . | . |
|  | . | . | . |
|  | . | . | . |
|  | E16 | 00000000000000 | 00 |

Referring to FIG. 4 again, in some embodiments, the brain-computer interface device 100 with multiple channels further includes a plurality of filter circuits 190A-190P. The filter circuits 190A-190P are respectively coupled to the pre-amplifiers 120A-120P and the multiplexer 130. The filter circuits 190A-190P are respectively configured to filter the amplified signals E1-E16 to output filtered signals. The multiplexer 130 is configured to respectively output, according to the control signal and the clock signal CLK, the filtered signals (that is, the signal W). For example, the filter circuits 190A-190P performs high frequency filtering and low frequency filtering on amplified signals from the pre-amplifiers 120A-120P to output filtered signals (that is, filtered amplified signals). The multiplexer 130 outputs the filtered signals under the control of the control signal and the clock signal CLK. In some embodiments, the filter circuits 190A-190P are, for example but not limited to, high-pass filters, low-pass filters, band-pass filters, or band-reject filters.

In some embodiments, the brain-computer interface device 100 with multiple channels further includes a wireless communication circuit 195. The wireless communication circuit 195 is coupled to the processor 160. The wireless communication circuit 195 is configured to transmit the compressed signal Z. Specifically, the wireless communication circuit 195 is controlled by the processor 160 to transmit the compressed signal Z from the processor 160 to outside, so that the data receiving and processing device 300 receives and processes the compressed signal Z (for example, performs a decoding process) to obtain the physiological data associated with the physiological signals.

In some embodiments, the wireless communication circuit 195 is a Wireless-Fidelity (Wi-Fi) circuit, a Bluetooth circuit, or a radio frequency circuit. In some preferred embodiments, in order to transmit a large amount of data while reducing transmission power consumption, the radio frequency circuit may be selected as the wireless communication circuit 195.

In some embodiments, the brain-computer interface device 100 with multiple channels further includes a clock circuit 196. The clock circuit 196 is coupled to the multiplexer 130, the analog-to-digital converter 140, the processor 160, and the comparator 170. The clock circuit 196 is configured to transmit a clock signal CLK for use by the multiplexer 130, the analog-to-digital converter 140, the processor 160, and the comparator 170. In some embodiments, a frequency of the clock signal CLK is greater than 15,000 Hz, which is preferably 30,000 Hz. In some embodiments, the frequency of the clock signal CLK may be adjusted according to a frequency of the physiological signal transmitted by a to-be-measured biological part. For example, the to-be-measured biological part is a cerebellum. Since a frequency of a physiological signal generated by the cerebellum is relatively high (for example, 7500 Hz), the frequency of the clock signal CLK may be set to being greater than 15,000 Hz, and preferably, 30,000 Hz, to obtain a plurality of physiological signals from the cerebellum. In some embodiments, the brain-computer interface device 100 with multiple channels calculates its own sampling capacity according to the frequency of the clock signal CLK, a sample size of the amplified signals E1-E16, and the number of the channels 110A-110P. For example, the processor 160 of the brain-computer interface device 100 with multiple channels reads the memory 150 to obtain the frequency value of the clock signal CLK, the sample size, and the number of the channels 110A-110P, and the processor 160 obtains the sampling capacity by multiplying the frequency value of the clock signal CLK by the sample size and the number of the channels 110A-110P. For example, if the sample size is 14 bits, the frequency of the clock signal CLK is 15,000 Hz, and the number of the channels 110A-110P is 16, the sampling capacity is 3.36 million bits per second. However, the present invention is not limited thereto. In some embodiments, the sample size is 16 bits.

In some embodiments, the data receiving and processing device 300 includes a wireless communication module, a storage module, and a processing module. The wireless communication module is configured to receive the compressed signal Z. The storage module is coupled to the wireless communication module. The storage module stores the compressed signal Z, a plurality of programs, and timing data from the wireless communication module. The processing module is coupled to the wireless communication module and the storage module. The processing module is configured to read the program in the storage module and decode the compressed signal Z. For example, the processing module complements, according to the timing data and the header H of each of the digital values in the compressed signal Z, the bit values of the compressed signal Z. For example, a total number of bit values of the digital value is preset to 14. If there is only the header H in the digital value, the digital value is complemented with the preset complementation data. For example, the digital value is complemented with 14 bit values with logic values of zero. If the number of the bit values in the digital value is less than 14, the digital value is compared with a previous digital value corresponding to the same one of the channels 110A-110P to complement the deleted bit values of the same higher bit, so that each of the digital values has 14 bit values (that is, each of the digital values has a complete preset total number of bit values), and undistorted physiological data (such as an electroencephalogram) related to physiological signals (such as brain wave signals) can be obtained.

In some embodiments, the data receiving and processing device 300 is, for example but not limited to a server, a laptop computer, a desktop computer, or the like. The wireless communication module is, for example but not limited to a communication interface. The storage module is, for example but not limited to an electronic erasable rewritable read-only memory, a flash memory, or the like. In some embodiments, the wireless communication module may match the wireless communication circuit 195, that is, if a radio frequency circuit is selected as the wireless communication circuit 195, a radio frequency module may be selected as the wireless communication module.

In some embodiments, the data receiving and processing device 300 may cooperate with a plurality of brain-computer interface devices 100 with multiple channels. One data receiving and processing device 300 corresponds to the plurality of brain-computer interface devices 100 with multiple channels. Each of the brain-computer interface devices 100 with multiple channels corresponds to a to-be-measured biological part. The brain-computer interface device 100 with multiple channels can automatically return the compressed signal Z according to a predetermined frequency. The data receiving and processing device 300 can obtain the compressed signal Z in real time and decode the compressed signal Z to obtain the physiological data, and the data receiving and processing device 300 also can analyze physiological data of a specific biological part (such as the cerebellum) when collecting sufficient physiological data to obtain a short-term or long-term health or activity status of the biological part.

Based on the above, according to some embodiments, the physiological signal is received through each of the channels and is converted from an analog signal to a digital signal. The compressed signal is generated by deleting bit values of higher bits of each of the digital values corresponding to the same channel that are the same as those of a previous digital value, so that not only the compressed signal has digital values related to the physiological signal of each of the channels, but also a plurality of digital values related to the physiological signals can be encompassed in a minimum data transmission amount. In this way, an external data receiving and processing terminal (for example, an operational device such as a desktop computer, a laptop computer, and the like) can obtain a large amount of physiological data (such as an electroencephalogram and the like) related to the physiological signals at one time by decoding the compressed signal. Therefore, efficiency of data transmission is improved, a large amount of undistorted data can be transmitted at one time during wireless transmission, and the power consumption of the brain-computer interface device with multiple channels and the volume of the internal modules are reduced. In addition, the brain-computer interface device with multiple channels may also determine, through a comparator, whether the output of the multiplexer is greater than the threshold value, to filter out a non-effective physiological signal (such as noise).

What is claimed is:

1. A brain-computer interface device with multiple channels adapted to process a plurality of physiological signals and comprising:
   a plurality of pre-amplifiers respectively configured to amplify the physiological signals to output amplified signals, wherein each of the pre-amplifiers corresponds to one of the channels;
   a multiplexer configured to respectively output the amplified signals according to a control signal and a clock signal;
   an analog-to-digital converter configured to convert the output of the multiplexer to a digital signal according to the clock signal, wherein the digital signal comprises a plurality of digital values, the clock signal comprises a plurality of clocks, the digital values respectively correspond to the clocks, and each of the digital values comprises a plurality of bit values;
   a memory coupled to the analog-to-digital converter and configured to store the digital signal; and
   a processor coupled to the memory and the multiplexer and configured to:
      add a header to each of the digital values according to the clock signal, wherein the headers respectively correspond to the channels; and
      delete bit values of higher bits of each of the digital values corresponding to the same channel that are the same as those of a previous digital value, to output a compressed signal.

2. The brain-computer interface device with multiple channels according to claim 1, further comprising a wireless communication circuit configured to transmit the compressed signal.

3. The brain-computer interface device with multiple channels according to claim 2, wherein the wireless communication circuit is a Wi-Fi circuit, a Bluetooth circuit, or a radio frequency circuit.

4. The brain-computer interface device with multiple channels according to claim 2, wherein a frequency of the clock signal is higher than 15,000 Hz.

5. The brain-computer interface device with multiple channels according to claim 1, further comprising:
   a comparator configured to obtain a comparison result according to the clock signal, the output of the multiplexer, and a threshold value, wherein when the output of the multiplexer is greater than the threshold value, the comparator uses the output as the comparison result, and when the output is not greater than the threshold value, the comparator uses a predetermined level as the comparison result; wherein
   the analog-to-digital converter is configured to convert the comparison result to the digital signal according to the clock signal; and
   the processor is configured to:
      delete the bit values of the higher bits of each of the digital values corresponding to the same channel that are the same as those of the previous digital value, wherein the higher bit does not comprise a lowest bit; and delete the bit values of the digital values corresponding to the predetermined level to output the compressed signal.

6. The brain-computer interface device with multiple channels according to claim 5, further comprising a wireless communication circuit configured to transmit the compressed signal.

7. The brain-computer interface device with multiple channels according to claim 6, wherein the wireless communication circuit is a Wi-Fi circuit, a Bluetooth circuit, or a radio frequency circuit.

8. The brain-computer interface device with multiple channels according to claim 6, wherein a frequency of the clock signal is higher than 15,000 Hz.

9. The brain-computer interface device with multiple channels according to claim 5, further comprising a digital-to-analog device configured to convert a set value to the threshold value.

10. The brain-computer interface device with multiple channels according to claim 9, further comprising a wireless communication circuit configured to transmit the compressed signal.

11. The brain-computer interface device with multiple channels according to claim 10, wherein the wireless communication circuit is a Wi-Fi circuit, a Bluetooth circuit, or a radio frequency circuit.

12. The brain-computer interface device with multiple channels according to claim 10, wherein a frequency of the clock signal is higher than 15,000 Hz.

13. The brain-computer interface device with multiple channels according to claim 9, further comprising a plurality of filter circuits respectively configured to filter the amplified signals and output filtered signals, wherein the multiplexer is configured to respectively output the filtered signals according to the control signal and the clock signal.

14. The brain-computer interface device with multiple channels according to claim 13, further comprising a wireless communication circuit configured to transmit the compressed signal.

15. The brain-computer interface device with multiple channels according to claim 14, wherein the wireless communication circuit is a Wi-Fi circuit, a Bluetooth circuit, or a radio frequency circuit.

16. The brain-computer interface device with multiple channels according to claim 14, wherein a frequency of the clock signal is higher than 15,000 Hz.

\* \* \* \* \*